United States Patent [19]

Walls

[11] 4,436,807

[45] Mar. 13, 1984

[54] DEVELOPER COMPOSITION WITH SODIUM, LITHIUM AND/OR POTASSIUM SALTS FOR DEVELOPING NEGATIVE WORKING IMAGED PHOTOGRAPHIC MATERIAL

[75] Inventor: John E. Walls, Wiesbaden Biebrich, Fed. Rep. of Germany

[73] Assignee: American Hoechst Corporation, Somerville, N.J.

[21] Appl. No.: 398,509

[22] Filed: Jul. 15, 1982

[51] Int. Cl.$^3$ .................... G03C 5/24; G03C 5/34; G03F 7/00
[52] U.S. Cl. ................................. 430/331; 430/302; 430/309; 430/157
[58] Field of Search ............... 430/331, 309, 175, 192, 430/190, 165, 191, 325, 302, 157, 149

[56] References Cited

U.S. PATENT DOCUMENTS

| | | | |
|---|---|---|---|
| 3,110,596 | 11/1963 | Heiss et al. | |
| 3,679,419 | 7/1972 | Gillich | 430/175 |
| 3,867,147 | 2/1975 | Teuscher | |
| 3,891,438 | 6/1975 | Katz et al. | 430/331 |
| 4,033,919 | 7/1977 | Lawson | 430/302 |
| 4,094,679 | 6/1978 | Washizawa et al. | 430/331 |
| 4,147,545 | 4/1979 | Rowe et al. | 430/331 |
| 4,259,434 | 3/1981 | Yamasue et al. | 430/331 |
| 4,314,022 | 2/1982 | Fisch | |
| 4,350,756 | 9/1982 | Burch et al. | 430/331 |
| 4,366,224 | 12/1982 | Hsieh | 430/331 |
| 4,374,920 | 2/1983 | Wanat et al. | 430/331 |
| 4,379,830 | 4/1983 | Deutsch | 430/331 |

*Primary Examiner*—Charles L. Bowers, Jr.
*Attorney, Agent, or Firm*—Richard S. Roberts

[57] ABSTRACT

This invention relates to a composition for developing photosensitive coatings especially coatings useful in making lithographic printing plates. The developing composition comprises an aqueous solution having a pH of from about 8 to about 12 of (a) a sodium, potassium or lithium salt of octyl, decyl or dodecyl monosulfate; and
(b) a sodium, lithium, potassium or ammonium metasilicate salt; and
(c) a lithium, potassium, sodium or ammonium borate salt; and
(d) an aliphatic dicarboxylic acid, or sodium, potassium or ammonium salt thereof having from 2 to 6 carbon atoms; and
(e) di-and/or tri-sodium or -potassium phosphate.

8 Claims, No Drawings

DEVELOPER COMPOSITION WITH SODIUM, LITHIUM AND/OR POTASSIUM SALTS FOR DEVELOPING NEGATIVE WORKING IMAGED PHOTOGRAPHIC MATERIAL

BACKGROUND OF THE INVENTION

The present invention relates to a composition for developing photosensitive coatings. More specifically, the present invention relates to a method of developing photosensitive lithographic printing plates and similar photographic elements. More particularly, the invention relates to aqueous alkaline developers suitable for removing the non-image areas of negative working photographic elements.

The art of lithographic printing depends upon the immiscibility of grease and water, upon the preferential retention of a greasy image-forming substance by an image area, and upon the similar retention of an aqueous dampening fluid by a non-image area. When a greasy image is imprinted upon a suitable surface and the entire surface is then moistened with an aqueous solution, the image area will repel the water and the non-image area will retain the water. Upon subsequent application of greasy ink, the image portion retains ink whereas the moistened non-image area repels it. The ink on the image area is then transferred to the surface of a material on which the image is to be reproduces, such as paper, cloth and the like, via an intermediary, a so-called offset or blanket cylinder, which is necessary to prevent mirror-image printing.

The most common type of lithographic plate to which the present invention is directed has a coating of a light-sensitive substance that is adherent to an aluminum base sheet. Depending upon the nature of the photosensitive coating employed, the treated plate may be utilized to reproduce directly the image to which it is exposed, in which case it is termed a positive acting plate, or to produce an image complementary to the one to which it is exposed, in which case it is termed a negative acting plate. In either case, the image area of the developed plate is oleophilic and the non-image is hydrophilic. Exposure is effected through a negative transparency, where the light sensitive material, commonly a diazo compound, is caused to harden and thereby become insoluble in a desensitizing solution applied to the plates after light exposure for the purpose of removing the part of the light sensitive coating which, because it was protected from the light by the negative, was not light hardened. The light hardened surface of a negative plate will be the oleophilic surface compatible with the greasy ink and is called the "image-area". The surface from which the non-hardened light sensitive material has been removed by a desensitizer will be, or can be, converted to a hydrophilic surface having little affinity for the greasy ink and is called the "non-image" area.

The present invention provides a new developer for negative working lithographic printing plates.

Most developing compositions for negative working printing plates disadvantageously contain strong organic solvents. These are both expensive and ecologically not favored. In recent years certain aqueous alkaline developing compositions have been developed and employed for such purposes. While they are less costly and dangerous to the environment, they do pose several technical problems. Specifically, they tend to corrode aluminum, foam and precipitate when used in developing machinery and additionally have a relatively slow development speed. The present invention provides a developing composition which substantially alleviates these problems.

SUMMARY OF THE INVENTION

The invention provides a developing composition which comprises an aqueous solution having a pH of from about 8 to about 12 of
 (a) a sodium, potassium or lithium salt of octyl, decyl or dodecyl monosulfate;
 (b) a sodium, lithium, potassium or ammonium metasilicate salt; and
 (c) a lithium, potassium, sodium or ammonium borate salt; and
 (d) an aliphatic dicarboxylic acid, or sodium, potassium or ammonium salt thereof having from 2 to 6 carbon atoms; and
 (e) di- and/or tri-sodium or -potassium phosphate.

It is, therefore, an object of the present invention to provide a negative working lithographic printing plate developer which is an aqueous alkaline solution.

It is a further object of the present invention to provide a negative working lithographic printing plate which alleviates the hereinbefore mentioned problems.

These and other objects of the instant invention will be in part discussed and in part apparent upon consideration of the detailed description of the preferred embodiments.

DETAILED DESCRIPTION OF THE PREFERRED EMBODIMENTS

In the production of a photographic element, a sheet substrate, preferably aluminum and the alloys thereof especially those aluminum compositions suitable for the manufacture of lithographic printing plates such as Alcoa 3003 and Alcoa 1100, which may or may not have been pretreated by standard graining and/or etching and/or anodizing techniques as are well known in the art, may be coated by spraying, brushing, dipping or other means with a composition suitable for use as an interlayer for lithographic plates. Standard metal substrate pretreatments include electrolytically anodizing in sulfuric and/or phosphoric acids, electrolytically etching in hydrochloric acid, and chemical or mechanical graining by well known methods, which are all known to the skilled worker. Interlayer compositions employable in the practice of this invention include aqueous solutions of alkali silicate and polyvinyl phosphonic acid.

Said substrate is then coated by means well known in the art with a photosensitive coating which comprises a negative working diazo photosensitizer and may contain suitable colorants, resins, acid stabilizers and other art recognized ingredients. After drying, the coated substrate is exposed to ultraviolet radiation through a photographic mask in a known manner.

The exposed photographic element is then developed to remove the non-image areas by cleaning with the developer solution provided in this invention.

The developer employed in an aqueous based solution which has an alkaline pH in the range of from about 8 to about 12, more preferably from about 9 to about 11 and most preferably from about 9.5 to about 10.5.

The composition contains a surfactant which is preferably a sodium, potassium or lithium salt of octyl, decyl or dodecyl monosulfate and most preferably of octyl monosulfate. These surfactants provide a stable solution at low temperatures. The preferred surfactant concentration ranges from about 0.05 to about 10% by weight, more preferably 0.5% to 6% and most preferably 1.0% to 4%. The solution also contains a corrosion inhibiting silicate compound, preferably a metasilicate. Useful silicates include sodium, potassium, lithium or ammonium metasilicate in an amount of from about 0.001% to about 5.0% by weight, more preferably 0.005% to 0.5% and most preferably 0.01% to 0.1%. The composition further contains a borate, preferably a tetraborate or pentaborate in the form of its lithium, potassium, sodium or ammonium salt. The borate, which aids corrosion resistance and desensitizes aluminum background areas, is present in an amount ranging from about 0.1% to about 15% by weight, preferably 0.5% to 8% and most preferably 1.0% to 4%. The composition also contains a dicarboxylic acid having from 2 to 6 carbon atoms or the salts thereof. Preferably an aliphatic dicarboxylic acid is used. These include oxalic, malonic, succinic, glutaric and adipic acids or the salts thereof such as the lithium, potassium, sodium or ammonium salts. One more preferred salt is potassium oxalate. This ingredient is preferably present in an amount of from about 0.01% to about 5% by weight, more preferably from 0.1% to 4% and most preferably from 0.5% to 3%. The composition further contains a phosphate salt. Such include sodium and potassium phosphate, preferably di- and tri-potassium and -sodium phosphate salts. Such may be present in an amount of from about 0.5% to 12%, preferably 0.75% to 6% and most preferably 1.0% to 4%. All parts herein are by weight.

In the preferred embodiment, it is most advantageous that a ratio exists between the elemental sodium and potassium within the composition. A most advantageous balance between developability and storage stability exists when the ratio of sodium to potassium ranges from about 1.0–1.4:1, more preferably 1.1–1.3:1, and most preferably 1.15–1.25:1. This aids storage at temperatures below 10° C. by substantially reducing or preventing precipitation.

The following examples illustrate the invention.

EXAMPLE 1

A developer is prepared having the following ingredients. All parts are anhydrous.

|  | % (W/W) |
|---|---|
| H$_2$O (deionized) | 91.73 |
| sodium octyl sulfate | 2.50 |
| sodium metasilicate | 0.07 |
| disodium phosphate | 1.50 |
| trisodium phosphate | 1.50 |
| potassium oxalate | 1.70 |

-continued

|  | % (W/W) |
|---|---|
| potassium tetraborate | 1.00 |

The developer is found to have a solid content of 8.27% and a pH of 10.3. When corrosion tests are conducted for 300 hours using aluminum a 0.002% gain in weight is noted. At 1° C. no precipitation or crystal formation is observed. The solution is then frozen and allowed to return to room temperature. At room temperature, a clear solution is observed in which there is no insoluble material.

An electrochemically grained and anodized plate is coated with a light sensitive diazo compound disclosed in U.S. Pat. No. 3,849,392 and is exposed (240 mJ/cm$^2$) using a negative test mask. The plate is developed using the composition of this example by immersion and light agitation for 60 seconds. A 21-step Stauffer Step Wedge, which is part of the test mask is inked and found to give a solid 7 and three ghost steps. Such a result is preferred and would be expected from a proper developer.

Another plate is likewise developed and after rinsing has a finishing film applied using the subject developer. A printing press roll-up test is conducted after 1 week of storage and was compared to a plate developed with the same developer but finished with a standard solution consisting essentially of tapioca dextrin as the film former. Both plates had similar roll-up characteristics with no hint of blinding or toning on the test plate.

EXAMPLE 2

A commercially available developer having a total solids content of 23%, of which 12% is sodium benzoate, is tested in a similar manner as detailed in Example 1. After 300 hours, a weight loss of 5.1% is measured. At 10° C. the solution begins to form a precipitate that only returns into solution at room temperature with agitation.

A plate is processed and only after extensive development time appears to be desensitized. A solid 7 and seven ghost steps are realized after inking.

EXAMPLE 3

Another commercially available developer having a solid content of 16% (11% organics) is tested in similar manner as described in Example 1. The results of the corrosion test after 300 hours indicated that 17.2% of the aluminum is dissolved. The plate developed with this developer is seen to be insufficiently desensitized in the background. A solid 9 and eight ghost steps are measured

EXAMPLES 4 THROUGH 13

The following examples demonstrate the results stemming from variations made in the inventive product

| Ingredients | Example 4 | Example 5 | Example 6 | Example 7 | Example 8 | Example 9 | Example 10 | Example 11 | Example 12 | Example 13 |
|---|---|---|---|---|---|---|---|---|---|---|
| Water | 93.43 | 92.73 | 93.80 | 90.94 | 91.91 | 90.16 | 91.73 | 91.44 | 90.23 | 92.48 |
| Na$_2$HPO$_4$ | 1.50 | 1.50 | 1.50 |  | 1.50 |  | 1.50 | 1.50 | 3.00 | 0.75 |
| Na$_3$PO$_4$ | 1.50 | 1.50 | 1.50 |  | 1.50 |  | 1.50 | 1.50 | 1.50 | 1.50 |
| K$_2$HPO$_4$ |  |  |  | 1.85 |  |  |  |  |  |  |
| K$_3$PO$_4$ |  |  |  | 1.94 |  |  |  |  |  |  |
| Na$_2$SiO$_3$ | 0.07 | 0.07 |  | 0.07 | 0.07 | 0.07 | 0.07 | 0.07 | 0.07 | 0.07 |
| Na$_2$B$_4$O$_7$ |  |  |  |  | 1.00 |  |  |  |  |  |
| K$_2$B$_4$O$_7$ | 1.00 |  | 1.00 | 1.00 |  | 1.00 | 1.00 | 1.00 | 1.00 | 1.00 |

-continued

| Ingredients | Example 4 | Example 5 | Example 6 | Example 7 | Example 8 | Example 9 | Example 10 | Example 11 | Example 12 | Example 13 |
| --- | --- | --- | --- | --- | --- | --- | --- | --- | --- | --- |
| KOH | | | | | | 1.14 | | | | |
| NaOH | | | | | | 1.94 | | | | |
| $Na_2C_2O_4$ (sodium oxalate) | | | | | 1.52 | | | | | |
| $K_2C_2O_4$ (potassium oxalate) | | 1.70 | 1.70 | 1.70 | | | 1.70 | | 1.70 | 1.70 |
| Na octyl sulfate | 2.50 | 2.50 | 2.50 | 2.50 | 2.50 | 2.50 | | 2.50 | 2.50 | 2.50 |
| Na decyl sulfate | | | | | | | 2.50 | | | |
| $H_2C_2O_4$ (oxalic acid) | | | | | | 0.92 | | | | |
| $K_2C_4H_4O_4$ (potassium succinate) | | | | | | | | 1.99 | | |
| $H_3PO_4$ (85%) | | | | | | 2.27 | | | | |

EXAMPLE 4

Example 4 repeats Example 1 except that the potassium oxalate is omitted. The pH is 10.27 and there is no precipitation at low temperatures. A plate is exposed (240 $mJ/cm^2$) and developed. Upon inking, the background appeared to be desensitized but the Step Wedge gives a solid 8 and five ghost steps. Such a result is unacceptable and demonstrates the utility of the oxalate.

EXAMPLE 5

Example 5 repeats Example 1 except the potassium tetraborate is omitted. The pH is 10.29. An exposed plate is developed and upon inking gives a solid 7 and five ghost steps. An aging test for corrosion shows after 300 hours that 3.47% is lost due to the inability of the silicate alone to prevent corrosion. It can be seen that the tetraborate aids in desensitization and corrosion inhibition.

EXAMPLE 6

Example 6 repeats Example 1 except that the sodium silicate is omitted. The pH is 10.18. An exposed plate is developed and upon inking gives results identical to those obtained when the silicate is present. After 300 hours, the corrosion study indicates that a 3.7% growth had occurred due to the continued deposition of salts. This example clearly demonstrates that the silicate and tetraborate should be present together so as to result in an essentially zero net change in weight grain or loss.

EXAMPLE 7

Example 7 uses the mole ratio equivalent amount of di- and tripotassium phosphate as is used for the sodium salts in Example 1. The results are all the same except that at 8° C., the developer is crystallized into a solid mass. Here the sodium to potassium ratio is 0.17 to 1.0.

EXAMPLE 8

Example 8 uses the mole ratio equivalent amount of sodium oxalate in lieu of potassium oxalate. An exposed plate is developed with the subject developer and then inked. The Step Wedge has a reading of a solid 7 and four ghost steps. At 1° C. there is no crystallization or precipitation. In this example the sodium to potassium ratio is 1.0 to 0.0 and it can be seen that although no precipitation was observed, it loses some strength in development.

EXAMPLE 9

Example 9 uses the acids and hydroxides in lieu of the salts to demonstrate an alternative embodiment. The developer, when tested, is substantially identical with the developer of Example 1.

EXAMPLE 10

A developer similar to that of Example 1 is made except that sodium decyl sulfate is used in lieu of sodium octyl sulfate. All aspects of performance are substantially identical except that at 8° C., there is a solid formation of crystals. Upon heating to room temperature, the crystals redissolve.

EXAMPLE 11

Example 1 uses the stoichiometric equivalent amount of potassium succinate for comparison. The results are essentially identical in all respects as those obtained from the developer containing potassium oxalate.

EXAMPLE 12

Example 12 uses twice the amount of disodium phosphate. Here the pH is measured to be 11.9 The resulting image after development is severely attacked and certain highlight areas are totally removed. The remaining image is also discolored.

EXAMPLE 13

Example 13 uses half the amount of disodium phosphate to lower the pH to 8.6. Although a plate is able to be developed with this developer, it requires a long time to do so. The resulting image is not fully desensitized in the shadow areas.

What is claimed is:

1. A developing composition capable of removing the unexposed non-image areas of an imagewise exposed negative working photographic element which comprises an aqueous solution having a pH of from about 8 to 12 of
    (a) a sodium, potassium or lithium salt of octyl, decyl or dodecyl monosulfate which is present in an amount of from about 0.05% to about 10%, and
    (b) a sodium, lithium, potassium or ammonium metasilicate salt which is present in an amount of from about 0.001% to about 5.0%, and
    (c) a lithium, potassium, sodium or ammonium borate salt which is present in an amount of from about 0.1% to about 15%, and
    (d) one or more compounds selected from the group consisting of oxalic, malonic, succinic, glutaric and adipic acids or a lithium, potassium, sodium or ammonium salt thereof which is present in an amount of from about 0.01% to about 5%, and
    (e) di- and/or tri-sodium or -potassium phosphate which is present in an amount of from about 0.5% to about 12%, and wherein both sodium and potassium compounds must be present in said composition and the ratio of sodium to potassium ranges from about 1:1 to about 1.4:2, and wherein said percentages are by weight of the solid parts of said composition.

2. The composition of claim 1 wherein said ingredient (a) is sodium octyl sulfate and/or sodium decyl sulfate.

3. The composition of claim 1 wherein said ingredient (b) is sodium metasilicate.

4. The composition of claim 1 wherein said ingredient (c) is potassium tetraborate.

5. The composition of claim 1 wherein said ingredient (d) is potassium oxalate.

6. The composition of claim 1 wherein said ingredient (e) is disodium phosphate and/or trisodium phosphate.

7. The composition of claim 1 wherein said ingredient (c) is a tetraborate or pentaborate.

8. The composition of claim 1 comprising sodium octyl sulfate, sodium metasilicate, disodium phosphate, trisodium phosphate, potassium oxalate and potassium tetraborate.

* * * * *